United States Patent
Lu et al.

(10) Patent No.: US 9,845,981 B2
(45) Date of Patent: Dec. 19, 2017

(54) LOAD ESTIMATOR FOR CONTROL OF VAPOR COMPRESSION COOLING SYSTEM WITH PUMPED REFRIGERANT ECONOMIZATION

(71) Applicant: Liebert Corporation, Columbus, OH (US)

(72) Inventors: Zongtao Lu, Pittsburgh, PA (US); Greg Haggy, Pickerington, OH (US); Timothy J. Schrader, Irwin, OH (US); Stephen Sillato, Westerville, OH (US); John F. Judge, Galena, OH (US)

(73) Assignee: Liebert Corporation, Columbus, OH (US)

( * ) Notice: Subject to any disclaimer, the term of this patent is extended or adjusted under 35 U.S.C. 154(b) by 788 days.

(21) Appl. No.: 14/046,451

(22) Filed: Oct. 4, 2013

(65) Prior Publication Data

US 2014/0033753 A1 Feb. 6, 2014

Related U.S. Application Data

(63) Continuation-in-part of application No. 13/446,374, filed on Apr. 13, 2012, now Pat. No. 9,038,404.
(Continued)

(51) Int. Cl.
*F25B 49/02* (2006.01)
*H05K 7/20* (2006.01)
(Continued)

(52) U.S. Cl.
CPC .............. *F25B 49/02* (2013.01); *F25B 23/00* (2013.01); *H05K 7/20827* (2013.01);
(Continued)

(58) Field of Classification Search
CPC .. F25B 49/02; F25B 23/00; F25B 2600/2501; F25B 2400/0411; F25B 2400/0401;
(Continued)

(56) References Cited

U.S. PATENT DOCUMENTS 2,146,796 A   2/1939   Dasher
2,244,312 A   6/1941   Newton
(Continued)

FOREIGN PATENT DOCUMENTS

CN   101694311 A   4/2010
CN   201964557U U   9/2011
(Continued)

OTHER PUBLICATIONS

Notification of Transmittal of the International Search Report and the Written Opinion of the International Searching Authority for PCT/US2013/063531, dated Jan. 14, 2014.
(Continued)

*Primary Examiner* — Kun Kai Ma
(74) *Attorney, Agent, or Firm* — Harness, Dickey & Pierce, P.L.C.

(57) ABSTRACT

A cooling system has a direct expansion mode and a pumped refrigerant economizer mode and a controller. The controller includes a load estimator that estimates real-time indoor load on the cooling system and uses the estimated real-time indoor load to determine whether to operate the cooling system in the pumped refrigerant economizer mode or in the direct expansion mode.

7 Claims, 10 Drawing Sheets

Related U.S. Application Data

(60) Provisional application No. 61/476,783, filed on Apr. 19, 2011, provisional application No. 61/527,695, filed on Aug. 26, 2011.

(51) Int. Cl.
  *F25B 23/00* (2006.01)
  *F25B 41/04* (2006.01)

(52) U.S. Cl.
  CPC ........ *H05K 7/20836* (2013.01); *F25B 41/043* (2013.01); *F25B 2400/0401* (2013.01); *F25B 2400/0403* (2013.01); *F25B 2400/0411* (2013.01); *F25B 2600/2501* (2013.01)

(58) Field of Classification Search
  CPC ........... F25B 2400/0403; F25B 41/043; H05K 7/20836; H05K 7/20827
  See application file for complete search history.

(56) References Cited

U.S. PATENT DOCUMENTS

| | | |
|---|---|---|
| 2,796,743 A | 6/1957 | Mcfarlan |
| 2,892,321 A | 6/1959 | Kritzer |
| 2,949,750 A | 8/1960 | Kramer |
| 3,133,424 A | 5/1964 | Palmer |
| 3,525,385 A | 8/1970 | Liebert |
| 4,040,268 A * | 8/1977 | Howard .............. F25B 5/00 62/335 |
| 4,142,381 A | 3/1979 | Lavigne, Jr. |
| 4,270,362 A | 6/1981 | Lancia et al. |
| 4,271,678 A | 6/1981 | Liebert |
| 4,483,151 A | 11/1984 | Fujioka et al. |
| 4,606,198 A | 8/1986 | Latshaw et al. |
| 4,732,008 A | 3/1988 | DeVault |
| 4,796,437 A | 1/1989 | James |
| 4,873,649 A | 10/1989 | Grald et al. |
| 5,007,247 A | 4/1991 | Danig |
| 5,050,394 A * | 9/1991 | Dudley ................ F24D 17/02 62/115 |
| 5,177,972 A | 1/1993 | Sillato et al. |
| 5,245,837 A | 9/1993 | Kitamoto |
| 5,251,453 A * | 10/1993 | Stanke ............... B60H 1/00978 62/126 |
| 5,709,100 A | 1/1998 | Baer et al. |
| 5,953,926 A * | 9/1999 | Dressler ................ F24F 3/147 236/44 C |
| 6,023,935 A | 2/2000 | Okazaki et al. |
| 6,026,654 A * | 2/2000 | Park .................... F24F 3/065 62/196.1 |
| 6,185,944 B1 | 2/2001 | Gaul |
| 6,293,119 B1 | 9/2001 | Wenzel |
| 6,324,856 B1 * | 12/2001 | Weng .................. F25B 7/00 62/175 |
| 6,543,240 B2 | 4/2003 | Grafton |
| 6,553,778 B2 * | 4/2003 | Tipton ................. F25B 39/02 62/196.1 |
| 6,735,965 B2 | 5/2004 | Moon et al. |
| 6,817,209 B1 | 11/2004 | Tiner |
| 6,871,509 B2 | 3/2005 | Grabon et al. |
| 6,978,630 B2 | 12/2005 | Wensink et al. |
| 7,032,411 B2 * | 4/2006 | Hebert ................ F25B 39/02 62/510 |
| 7,086,248 B2 | 8/2006 | Sakai et al. |
| 7,293,425 B2 | 11/2007 | Tamura et al. |
| 7,406,839 B2 | 8/2008 | Bean et al. |
| 7,658,079 B2 | 2/2010 | Bailey et al. |
| 7,775,055 B2 | 8/2010 | Bean et al. |
| 7,900,468 B2 | 3/2011 | Spearing |
| 9,021,820 B2 * | 5/2015 | Yahia ................. B60H 1/00921 165/202 |
| 2004/0045304 A1 | 3/2004 | Park |
| 2006/0090507 A1 | 5/2006 | Taras et al. |
| 2006/0225445 A1 | 10/2006 | Lifson et al. |
| 2006/0272342 A1 | 12/2006 | Bash et al. |
| 2007/0022777 A1 * | 2/2007 | Takegami ............... F25B 13/00 62/498 |
| 2007/0130989 A1 | 6/2007 | Tsuboi et al. |
| 2007/0214817 A1 * | 9/2007 | Inaba ................. B60H 1/00885 62/238.6 |
| 2008/0029250 A1 | 2/2008 | Carlson et al. |
| 2008/0041079 A1 | 2/2008 | Nishijima et al. |
| 2008/0115523 A1 | 5/2008 | Bailey et al. |
| 2008/0190134 A1 | 8/2008 | Khatib et al. |
| 2009/0019884 A1 * | 1/2009 | Sekine ................. F24F 11/0086 62/515 |
| 2009/0080173 A1 | 3/2009 | Porter et al. |
| 2009/0205345 A1 | 8/2009 | Narayanamurthy et al. |
| 2009/0210095 A1 | 8/2009 | Bush et al. |
| 2009/0249807 A1 | 10/2009 | Nemesh et al. |
| 2009/0288432 A1 | 11/2009 | Lifson et al. |
| 2010/0023166 A1 | 1/2010 | Chessel et al. |
| 2010/0036530 A1 | 2/2010 | Chessel et al. |
| 2010/0036531 A1 | 2/2010 | Chessel et al. |
| 2010/0050669 A1 | 3/2010 | Poux et al. |
| 2010/0070082 A1 | 3/2010 | Chessel et al. |
| 2010/0094434 A1 | 4/2010 | Ballet et al. |
| 2010/0107658 A1 * | 5/2010 | Cockrell ............ H05K 7/20827 62/62 |
| 2010/0107659 A1 | 5/2010 | Hildreth, Jr. |
| 2010/0229587 A1 | 9/2010 | Liu et al. |
| 2010/0236263 A1 | 9/2010 | Park |
| 2010/0242534 A1 | 9/2010 | Stockton, Jr. |
| 2010/0275628 A1 * | 11/2010 | Moseley ................ F04B 49/10 62/228.1 |
| 2010/0319375 A1 * | 12/2010 | Matsubara ............ F25B 49/022 62/228.1 |
| 2011/0023508 A1 | 2/2011 | Bean et al. |
| 2012/0111027 A1 * | 5/2012 | Campbell ............... F25B 21/02 62/3.3 |
| 2012/0167602 A1 | 7/2012 | Taras et al. |

FOREIGN PATENT DOCUMENTS

| | | |
|---|---|---|
| CN | 102297481 A | 12/2011 |
| CN | 102538101 A | 7/2012 |
| CN | 102573423 A | 7/2012 |
| EP | 2389056 A1 | 11/2011 |
| JP | 2001263835 A * | 9/2001 |
| JP | 2001263835 A | 9/2001 |
| JP | 2004175290 A | 6/2004 |
| JP | 2004175290 A * | 6/2004 |
| WO | WO-03083631 A1 | 10/2003 |
| WO | WO-2007044235 A2 | 4/2007 |
| WO | WO-2008026792 A1 | 3/2008 |
| WO | WO-2008076120 A1 | 6/2008 |
| WO | WO-2008079116 A1 | 7/2008 |
| WO | WO-2008079118 A1 | 7/2008 |
| WO | WO-2008079119 A1 | 7/2008 |
| WO | WO-2008079138 A1 | 7/2008 |
| WO | WO-2008082378 A1 | 7/2008 |
| WO | WO-2008082379 A1 | 7/2008 |
| WO | WO-2009102975 A2 | 8/2009 |

OTHER PUBLICATIONS

Precision Versus Comfort Cooling Choosing a Cooling System to Support Business-Critical IT Environments—Emerson Network Power © 2010, Liebert Corporation.
European Search Report for EP11166482.7 dated Oct. 5, 2011.
Notification of Transmittal of the International Search Report and the Written Opinion of the International Searching Authority for PCT/US2012/033740, dated Oct. 4, 2012.
Chinese Office Action regarding Application No. 201380061001.0, dated Dec. 23, 2016.

* cited by examiner

LOAD ESTIMATOR FOR CONTROL OF VAPOR COMPRESSION COOLING SYSTEM WITH PUMPED REFRIGERANT ECONOMIZATION

CROSS-REFERENCE TO RELATED APPLICATIONS

This application is a non-provisional of 61/710,138, filed Oct. 5, 2012 and is continuation-in-part of U.S. patent application Ser. No. 13/446,374 filed Apr. 13, 2012. U.S. Ser. No. 13/446,374 claims the benefit of U.S. Provisional Application Nos. 61/476,783, filed on Apr. 19, 2011 and 61/527,695, filed on Aug. 26, 2011. The entire disclosures of each of the above applications are incorporated herein by reference.

The present disclosure relates to cooling systems, and more particularly, to high efficiency cooling systems.

BACKGROUND

This section provides background information related to the present disclosure which is not necessarily prior art.

Cooling systems have applicability in a number of different applications where fluid is to be cooled. They are used in cooling gas, such as air, and liquids, such as water. Two common examples are building HVAC (heating, ventilation, air conditioning) systems that are used for "comfort cooling," that is, to cool spaces where people are present such as offices, and data center climate control systems.

A data center is a room containing a collection of electronic equipment, such as computer servers. Data centers and the equipment contained therein typically have optimal environmental operating conditions, temperature and humidity in particular. Cooling systems used for data centers typically include climate control systems, usually implemented as part the control for the cooling system, to maintain the proper temperature and humidity in the data center.

FIG. 1 shows an example of a typical data center 100 having a climate control system 102 (also known as a cooling system). Data center 100 illustratively utilizes the "hot" and "cold" aisle approach where equipment racks 104 are arranged to create hot aisles 106 and cold aisles 108. Data center 100 is also illustratively a raised floor data center having a raised floor 110 above a sub-floor 112. The space between raised floor 110 and sub-floor 112 provides a supply air plenum 114 for conditioned supply air (sometimes referred to as "cold" air) flowing from computer room air conditioners ("CRACs") 116 of climate control system 102 up through raised floor 110 into data center 100. The conditioned supply air then flows into the fronts of equipment racks 104, through the equipment (not shown) mounted in the equipment racks where it cools the equipment, and the hot air is then exhausted out through the backs of equipment racks 104, or the tops of racks 104. In variations, the conditioned supply air flows into bottoms of the racks and is exhausted out of the backs of the racks 104 or the tops of the racks 104.

It should be understood that data center 100 may not have a raised floor 110 nor plenum 114. In this case, the CRAC's 116 would draw in through an air inlet (not shown) heated air from the data center, cool it, and exhaust it from an air outlet 117 shown in phantom in FIG. 1 back into the data center. The CRACS 116 may, for example, be arranged in the rows of the electronic equipment, may be disposed with their cool air supply facing respective cold aisles, or be disposed along walls of the data center.

In the example data center 100 shown in FIG. 1, data center 100 has a dropped ceiling 118 where the space between dropped ceiling 118 and ceiling 120 provides a hot air plenum 122 into which the hot air exhausted from equipment racks 104 is drawn and through which the hot air flows back to CRACs 116. A return air plenum (not shown) for each CRAC 116 couples that CRAC 116 to plenum 122.

CRACs 116 may be chilled water CRACs or direct expansion (DX) CRACs. CRACs 116 are coupled to a heat rejection device 124 that provides cooled liquid to CRACs 116. Heat rejection device 124 is a device that transfers heat from the return fluid from CRACs 116 to a cooler medium, such as outside ambient air. Heat rejection device 124 may include air or liquid cooled heat exchangers. Heat rejection device 124 may also be a refrigeration condenser system, in which case a refrigerant is provided to CRACs 116 and CRACs 116 may be phase change refrigerant air conditioning systems having refrigerant compressors, such as a DX system. Each CRAC 116 may include a control module 125 that controls the CRAC 116.

In an aspect, CRAC 116 includes a variable capacity compressor and may for example include a variable capacity compressor for each DX cooling circuit of CRAC 116. It should be understood that CRAC 116 may, as is often the case, have multiple DX cooling circuits. In an aspect, CRAC 116 includes a capacity modulated type of compressor or a 4-step semi-hermetic compressor, such as those available from Emerson Climate Technologies, Liebert Corporation or the Carlyle division of United Technologies. CRAC 116 may also include one or more air moving units 119, such as fans or blowers. The air moving units 119 may be provided in CRACs 116 or may additionally or alternatively be provided in supply air plenum 114 as shown in phantom at 121. Air moving units 119, 121 may illustratively have variable speed drives.

A typical CRAC 200 having a typical DX cooling circuit is shown in FIG. 2. CRAC 200 has a cabinet 202 in which an evaporator 204 is disposed. Evaporator 204 may be a V-coil assembly. An air moving unit 206, such as a fan or squirrel cage blower, is also disposed in cabinet 202 and situated to draw air through evaporator 204 from an inlet (not shown) of cabinet 202, where it is cooled by evaporator 204, and direct the cooled air out of plenum 208. Evaporator 204, a compressor 210, a condenser 212 and an expansion valve 214 are coupled together in known fashion in a DX refrigeration circuit. A phase change refrigerant is circulated by compressor 210 through condenser 212, expansion valve 214, evaporator 204 and back to compressor 210. Condenser 212 may be any of a variety of types of condensers conventionally used in cooling systems, such as an air cooled condenser, a water cooled condenser, or glycol cooled condenser. It should be understood that condenser 210 is often not part of the CRAC but is located elsewhere, such as outside the building in which the CRAC is located. Compressor 210 may be any of a variety of types of compressors conventionally used in DX refrigeration systems, such as a scroll compressor. When evaporator 204 is a V-coil or A-coil assembly, it typically has a cooling slab (or slabs) on each leg of the V or A, as applicable. Each cooling slab may, for example, be in a separate cooling circuit with each cooling circuit having a separate compressor. Alternatively, the fluid circuits in each slab such as where there are two slabs and two compressor circuits, can be intermingled among the two compressor circuits.

Evaporator 204 is typically a fin-and-tube assembly and is used to both cool and dehumidify the air passing through them. Typically, CRAC's such as CRAC 200 are designed so that the sensible heat ratio ("SHR") is typically between 0.85 and 0.95.

A system known as the GLYCOOL free-cooling system is available from Liebert Corporation of Columbus, Ohio. In this system, a second cooling coil assembly, known as a "free cooling coil," is added to a CRAC having a normal glycol system. This second coil assembly is added in the air stream ahead of the first cooling coil assembly. During colder months, the glycol solution returning from the outdoor drycooler is routed to the second cooling coil assembly and becomes the primary source of cooling to the data center. At ambient temperatures below 35 deg. F., the cooling capacity of the second cooling coil assembly is sufficient to handle the total cooling needs of the data center and substantially reduces energy costs since the compressor of the CRAC need not be run. The second or free cooling coil assembly does not provide 100% sensible cooling and has an airside pressure drop similar to the evaporator (which is the first cooling coil assembly).

Efficiency of cooling systems has taken on increased importance. According to the U.S. Department of Energy, cooling and power conversion systems for data centers consume at least half the power used in a typical data center. In other words, less than half the power is consumed by the servers in the data center. This has led to increased focus on energy efficiency in data center cooling systems.

SUMMARY

In accordance with an aspect of the present disclosure, a cooling system includes a cabinet having an air inlet and an air outlet and a cooling circuit that includes an evaporator disposed in the cabinet, a condenser, a compressor, an expansion device and a liquid pump. The cooling system has a direct expansion mode wherein the compressor is on and compresses a refrigerant in a vapor phase to raise its pressure and thus its condensing temperature and refrigerant is circulated around the cooling circuit by the compressor. The cooling system also has a pumped refrigerant economizer mode wherein the compressor is off and the liquid pump is on and pumps the refrigerant in a liquid phase and refrigerant is circulated around the cooling circuit by the liquid pump and without compressing the refrigerant in its vapor phase. In an aspect, the cooling system has a controller coupled to the liquid pump and the compressor that turns the compressor off and the liquid pump on to operate the cooling circuit in the economizer mode and turns the compressor on to operate the cooling circuit in the direct expansion mode. In an aspect, the controller includes a load estimator that estimates real-time indoor load on the cooling system and uses the estimated real-time indoor load to determine whether to operate the cooling system in the pumped refrigerant economizer mode or in the direct expansion mode.

In an aspect, the load estimator calculates the real-time indoor load based on the indoor return air temperature, the supply air temperature and the volume of air flow across the evaporator. In an aspect, if supply air temperature is not available, the load estimator uses compressor loading information instead.

In an aspect, the cooling circuit includes a receiver/surge tank coupled between the condenser and the liquid pump.

In an aspect, the cooling system includes a plurality of cooling circuits with each cooling circuit included in one of a plurality of cooling stages including an upstream cooling stage and a downstream cooling stage wherein the evaporator of the cooling circuit of the upstream cooling stage (upstream evaporator) and the evaporator of the cooling circuit of the downstream cooling stage (downstream evaporator) are arranged in the cabinet so that air to be cooled passes over them in serial fashion, first over the upstream evaporator and then over the downstream evaporators. The cooling circuit of each cooling stage has the direct expansion mode wherein the compressor of that cooling circuit is on and the refrigerant is circulated around the cooling circuit by the compressor of that cooling circuit and a pumped refrigerant economizer mode wherein the compressor of that cooling circuit is off and the liquid pump of that cooling circuit is on and the refrigerant is circulated around the cooling circuit by the liquid pump of that cooling circuit. In an aspect, when one of the upstream and downstream cooling stages can be in the economizer mode and the other must be in the direct expansion mode, the controller operates the cooling circuit of the upstream cooling stage in the economizer mode turning the liquid pump of that cooling circuit on and the compressor of that cooling circuit off and operates the downstream cooling stage in the direct expansion mode turning the compressor of the downstream cooling circuit on.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

In accordance with an aspect of the present disclosure, a high efficiency cooling system includes staged cooling provided by two or more cooling circuits arranged so that air to be cooled flows through them serially. In an aspect, each cooling circuit includes a tandem digital scroll compressor made up of a fixed capacity scroll compressor and digital scroll compressor. It should be understood that instead of tandem digital compressors, a plurality of compressors can be plumbed in parallel and these compressors may have differing capacities. In an aspect, each cooling circuit includes a DX cooling circuit and a pumped refrigerant economization circuit that bypasses the compressor when the outdoor temperature is sufficiently low to provide the requisite cooling to the refrigerant being circulating in the cooling circuit. In an aspect, the high efficiency cooling system also includes one or more fans, blowers or similar air moving units that move air to be cooled through the evaporators of each cooling circuit. The motors of the air moving unit may illustratively be variable speed motors, and may illustratively be electronically controlled motors. The same may be the case for the fan motors for the condenser. In an aspect, the cooling circuits of the high efficiency cooling system include an electronic expansion valve.

It should be understood that a cooling system can have less than all these elements, and can have various combinations of them. For example, the cooling system may not have staged cooling but have a cooling circuit that includes a DX cooling circuit and the pumped refrigerant economization circuit. In this aspect, the tandem digital scroll may or may not be utilized.

Figure 3:
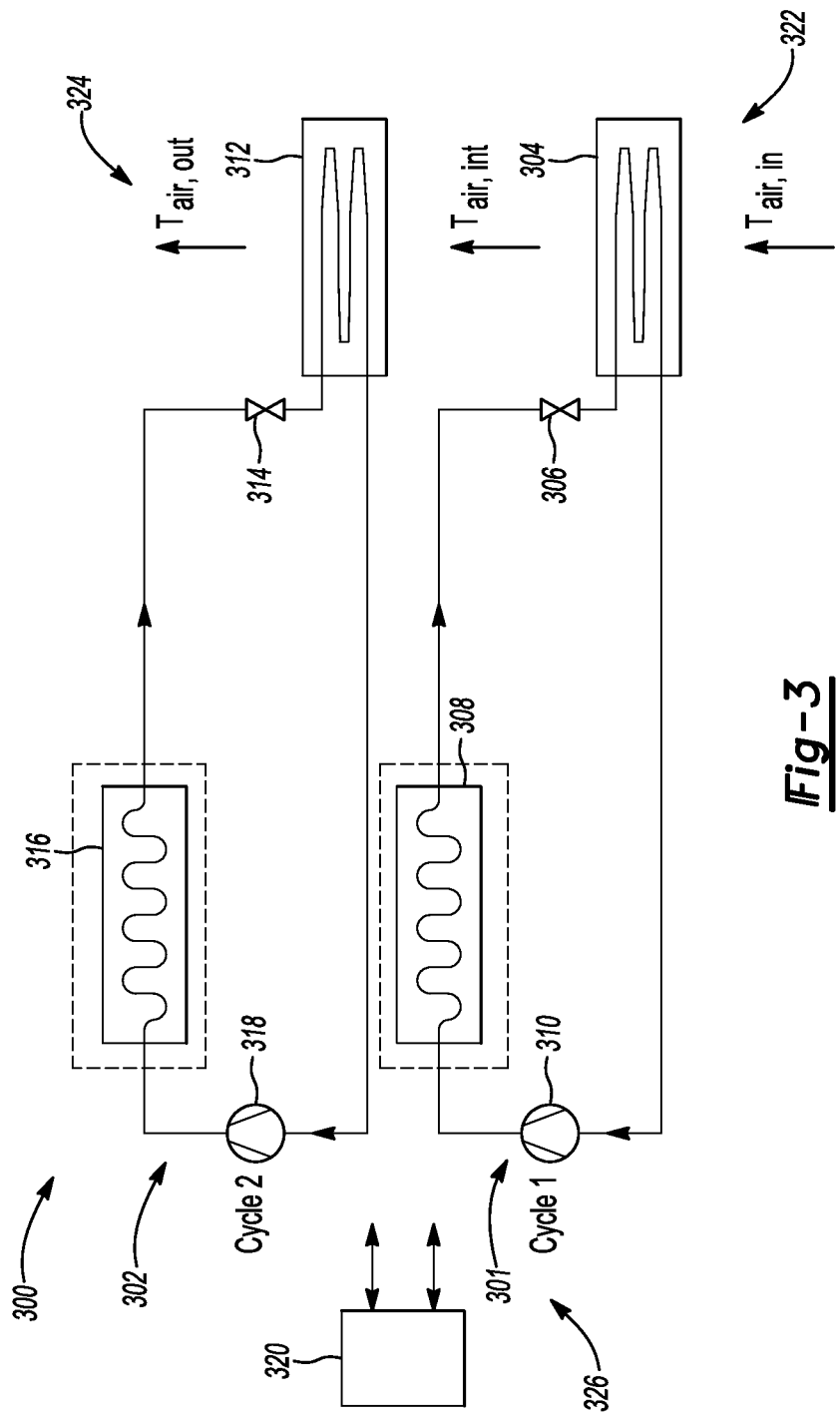
FIG. 3 is a schematic showing a CRAC having staged cooling provided by two cooling circuits.

FIG. 3 is a simplified schematic of a cooling system 300 having a plurality of cooling stages including an upstream cooling stage 322 with an upstream cooling circuit 301 and a downstream cooling stage 324 with a downstream cooling circuit 302 in accordance with an aspect of the present disclosure. In the embodiment of FIG. 3, cooling circuits 301, 302 are both DX refrigeration circuits. Upstream cooling circuit 301 includes an evaporator referred to as upstream evaporator 304, expansion valve 306, condenser 308 and compressor 310 arranged in a conventional DX refrigeration circuit. Downstream cooling circuit 302 includes an evaporator referred to as downstream evaporator 312, expansion valve 314, condenser 316 and compressor 318 arranged in a conventional DX refrigeration circuit. In this regard, evaporator 304, expansion valve 306 and compressor 310 of upstream cooling circuit 301 and evaporator 312, expansion valve 314 and compressor 318 of downstream cooling circuit 302 may all be included in a CRAC 326 located in a data center along with controller 320. Condensers 308, 316 are shown in dashed boxes as they are typically not included in CRAC 326 but located elsewhere, such as outside the building in which CRAC 326 is located. Expansion valves 306, 314 may preferably be electronic expansion valves, but may also be thermostatic expansion valves such as those disclosed in U.S. Pat. No. 4,606,198. In each DX refrigeration circuit 301, 302, a refrigerant is circulated by the compressor and it flows from the compressor, through the condenser, expansion valve, evaporator and back to the compressor. The evaporators 304, 312 of upstream and downstream cooling circuits 301, 302 are arranged in stages so that air drawn in through an inlet of the CRAC flows in serial fashion through evaporators 304, 312, that is, the air flows first through the upstream evaporator 304 in upstream cooling circuit 301 and then through downstream evaporator 312 in the downstream cooling circuit 302. By having a plurality of cooling stages arranged for serial air flow therethrough, the temperature differential across the evaporators of each DX refrigeration circuit is reduced. This in turn allows the evaporators in each DX refrigeration circuit to operate at different pressure levels and allows the pressure differences between the respective evaporators and condensers to be reduced. Since compressor power is a function of the pressure difference between the evaporator and condenser, a lower pressure difference is more energy efficient. It should be understood that each compressor 310, 318 may include tandem compressors with one compressor a fixed capacity compressor and the other compressor a variable capacity compressor, such as a digital scroll compressor. Each compressor 310, 318 may be a tandem digital scroll compressor that includes a fixed capacity scroll compressor and a digital scroll compressor, as discussed in more detail below.

Figure 1:
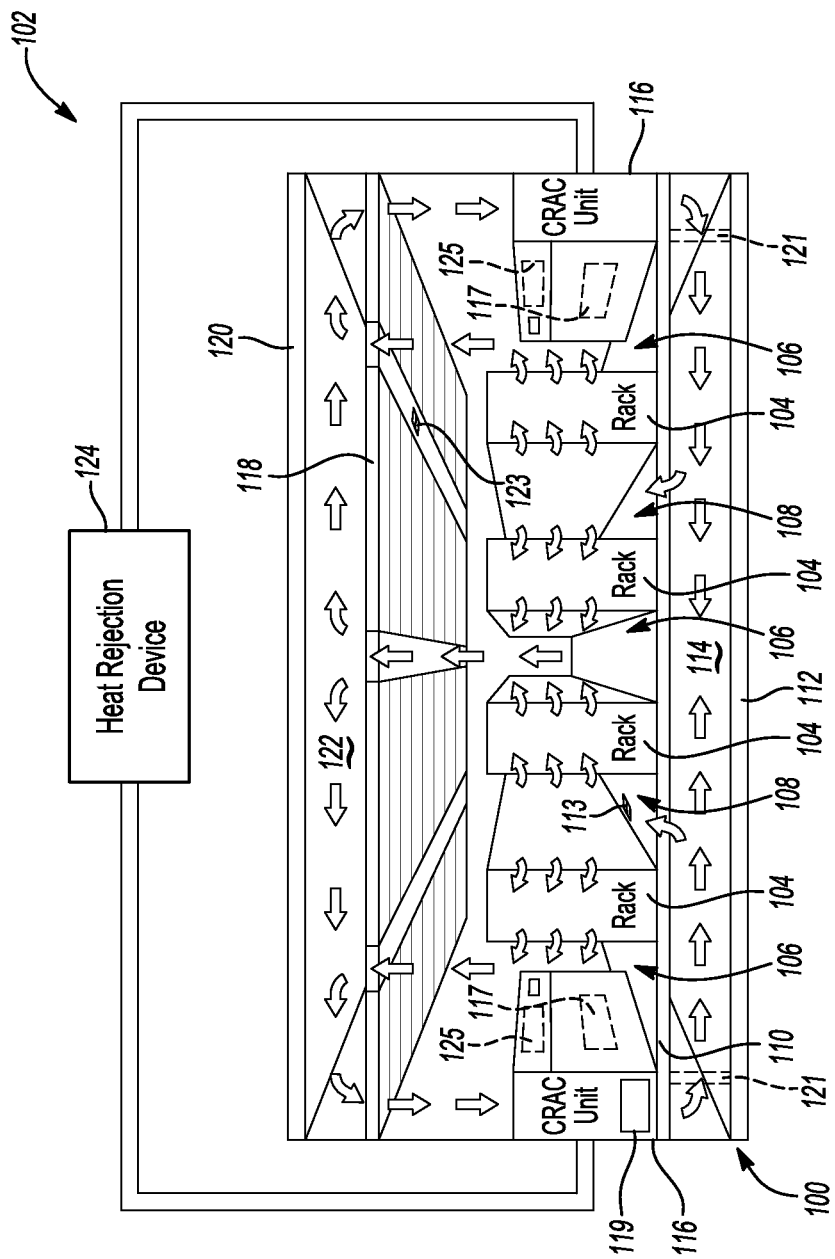
FIG. 1 is a schematic illustrating a prior art data center.

It should be understood that condensers 308, 316 can be any of the heat rejection devices described above with regard to heat rejection device 124 of FIG. 1.

The cooling circuit of each stage provides a portion of the overall cooling provided by CRAC 326 of cooling system 300. The portions can be equal, with each stage providing equal cooling, or they can be different. More specifically, each cooling stage has a maximum temperature difference that is a portion of the maximum temperature difference across CRAC 326. For example, if CRAC 326 has a maximum temperature difference of 20 deg. F., the cooling circuit of each stage has a maximum temperature difference that is some percentage of 20 deg. F. This may be an equal percentage, in which case cooling circuit 301, 302 each have a maximum 10 deg. F. temperature difference where the maximum temperature difference across CRAC 326 is 20 deg. F., or the percentages may be different.

Cooling system includes controller 320 that controls cooling circuits 301, 302.

In an aspect, evaporators 304, 312 may have a plurality of cooling slabs, such as in a V-coil assembly, and instead of having each cooling slab of downstream evaporator 312 be fed by separate compressors, both cooling slabs of downstream evaporator 312 would be fed by a compressor and both cooling slabs of upstream evaporator 304 would be fed by another compressor. These two compressors would preferably have equal capacity and the staged cooling allows the two compressors to be smaller (lesser capacity) than the two compressors used to feed the two cooling slabs of an evaporator in a typical prior art CRAC having DX refrigeration circuits for the two cooling slabs that provide comparable cooling capacity.

In an alternate embodiment, compressor 318 in downstream cooling circuit 302 is larger (that is, has a higher capacity) than compressor 310 in upstream cooling circuit 301 in order to decrease the evaporating temperature of the refrigerant provided to downstream evaporator 312. This in turn decreases the sensible heat ratio and increases the dehumidification capabilities of downstream cooling circuit 302. In this embodiment, downstream evaporator 312 may have the same cooling surface area as that of upstream evaporator 304 in upstream cooling circuit 301, or may have a cooling surface area that is different (larger or smaller) than the surface cooling area of upstream evaporator 304.

In an aspect, upstream evaporator 304 in upstream cooling circuit 301 is a microchannel cooling coil assembly. Upstream evaporator 304 may illustratively be a microchannel heat exchanger of the type described in U.S. Ser. No. 12/388,102 filed Feb. 18, 2009 for "Laminated Manifold for Microchannel Heat Exchanger" the entire disclosure of which is incorporated herein by reference. Upstream evaporator 304 may illustratively be a MCHX microchannel heat exchanger available from Liebert Corporation of Columbus, Ohio. When upstream evaporator 304 is a micro-channel heat exchanger, upstream cooling circuit 301 is illustratively configured to provide sensible only cooling, such as providing a temperature delta across upstream evaporator 304 that does not drop the temperature of the air exiting upstream evaporator 304 below its dewpoint, or below a temperature a certain number of degrees above the dewpoint, such as about 4 deg. F. While one advantage of using a microchannel cooling coil assembly for upstream evaporator 304 of upstream cooling circuit 301 is that microchannel cooling coil assemblies have air side pressure drops across them that are significantly less than fin-and-tube cooling coil assemblies having comparable cooling capacity, it should be understood that upstream evaporator 304 can be other than a microchannel cooling coil, and may for example be a fin-and-tube cooling coil assembly.

In an aspect, downstream evaporator 312 of downstream cooling circuit 302 is a fin-and-tube cooling coil assembly. In an aspect, downstream evaporator 312 is a microchannel cooling coil assembly.

Figure 4:
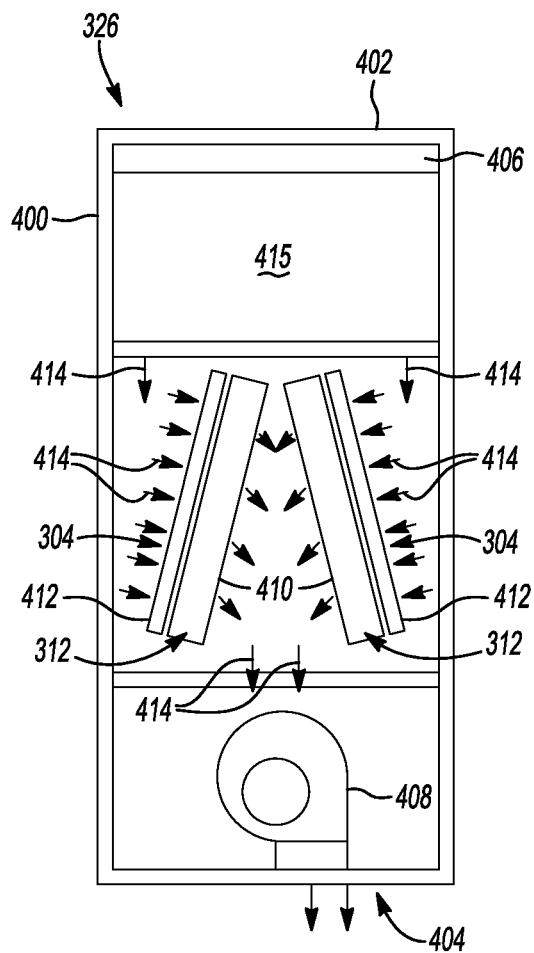
FIG. 4 is a simplified perspective view of a CRAC having the cooling circuits of the CRAC of FIG. 3.

FIG. 4 shows an illustrative embodiment of CRAC 326. CRAC 326 includes a cabinet 400 having a return air inlet 402 and an air outlet 404, such as a plenum. An air filter 406 is disposed at return air inlet 402 so that air flowing into CRAC 326 through return air inlet 402 flows through air filter 406 before flowing through the rest of CRAC 326. Arrows 414 show the direction of air flow through CRAC 326.

In the embodiment shown in FIG. 4, downstream evaporator 312 of downstream cooling circuit 302 is an A-coil assembly disposed in cabinet 400 between return air inlet 402 and air outlet 404. Downstream evaporator 312 thus has a cooling slab 410 for each leg of the A. Upstream evaporator 304 is also an A-coil assembly having a cooling slab 412 for each leg of the A. An air moving unit 408, such as a fan or squirrel cage blower, is disposed in cabinet 400 between a downstream side of downstream evaporator 312 and air outlet 404. One of the cooling slabs 412 of upstream evaporator 304 is disposed on the air inlet side of one of the cooling slabs 410 of downstream evaporator 312 and the other of the cooling slabs 412 of upstream evaporator 304 is disposed on the air inlet side of the other of the cooling slabs 410 of downstream evaporator 312. The cooling slabs 410 of downstream evaporator 312 and the cooling slabs 412 of upstream evaporator 304 are thus arranged in pairs, with respective ones of the cooling slabs 412 of upstream evaporator paired with respective ones of the cooling slabs 410 of downstream evaporator 312. In should be understood that air moving unit 408 may alternatively be disposed upstream of upstream evaporator 304.

While the downstream evaporator discussed above was a A-coil assembly, and in an aspect the upstream evaporator discussed above was also a A-coil assembly, it should be understood that the staged cooling system could utilize a V-coil assembly as the downstream evaporator and in an aspect, utilize an V-coil assembly as the upstream evaporator It should also be understood that the upstream and downstream evaporators could each utilize a large, inclined cooling slab, or a flat cooling slab.

In accordance with another aspect of the present disclosure, a cooling system, which may include a CRAC, includes a DX cooling circuit with a pumped refrigerant economizer enabling the system to be run in a pumped refrigerant economizer mode when the temperature outside is cold enough to cool the cooling fluid circulating in the cooling circuit and bypass the compressor. The cooling fluid may illustratively be a phase change refrigerant having a vapor phase and a liquid phase. The pumped refrigerant economizer may illustrativley include a pump that circulates the cooling fluid, illustratively the refrigerant in its liquid phase, with the compressor bypassed. This cooling system then uses the pump instead of the compressor to pump the refrigerant in its liquid phase and circulate the refrigerant when the outside air temperature is low enough to provide the heat exchange without compressing the refrigerant in its vapor phase to a higher pressure/condensing temperature. The economizer mode significantly increases the cooling system's sensible coefficient of performance (COP) when the cooling system switches to the economizer mode as described below. In terms of annual efficiency, the climate determines the benefit. For instance, modeling has shown that the annual energy efficiency increase in Washington D.C. is about 26%, while in Minneapolis, Minn., the annual energy efficiency increase is about 53%.

As discussed above, a conventional DX air conditioning system contains an evaporator, a compressor, a condenser and an expansion device. Often the air being cooled is at a lower temperature than the outside air. Because of this, a compressor is required to raise the pressure of the refrigerant in its vapor phase, and therefore its condensing temperature, to a higher temperature than the outside air so that the heat can be rejected. In any application in which heat is rejected to the outdoors even in the middle of the winter, the need to compress the cooling fluid consumes energy unnecessarily.

When the outdoor temperature becomes low enough to provide the overall required temperature difference between the inside air from which the heat is removed and the outside air to which the heat is rejected, there is no need to compress the refrigerant in its vapor phase to a higher pressure/temperature. When that is the case, the cooling system in accordance with this aspect of the present disclosure switches from DX (compressor) mode to pumped refrigerant economizer mode. In the pumped refrigerant economizer mode, the refrigerant is pumped in its liquid phase by a liquid pump to circulate the refrigerant in the cooling circuit without compressing the refrigerant in its vapor phase. The advantage is that the pump consumes roughly $\frac{1}{10}$ of the power consumed by the compressor.

Figure 2:
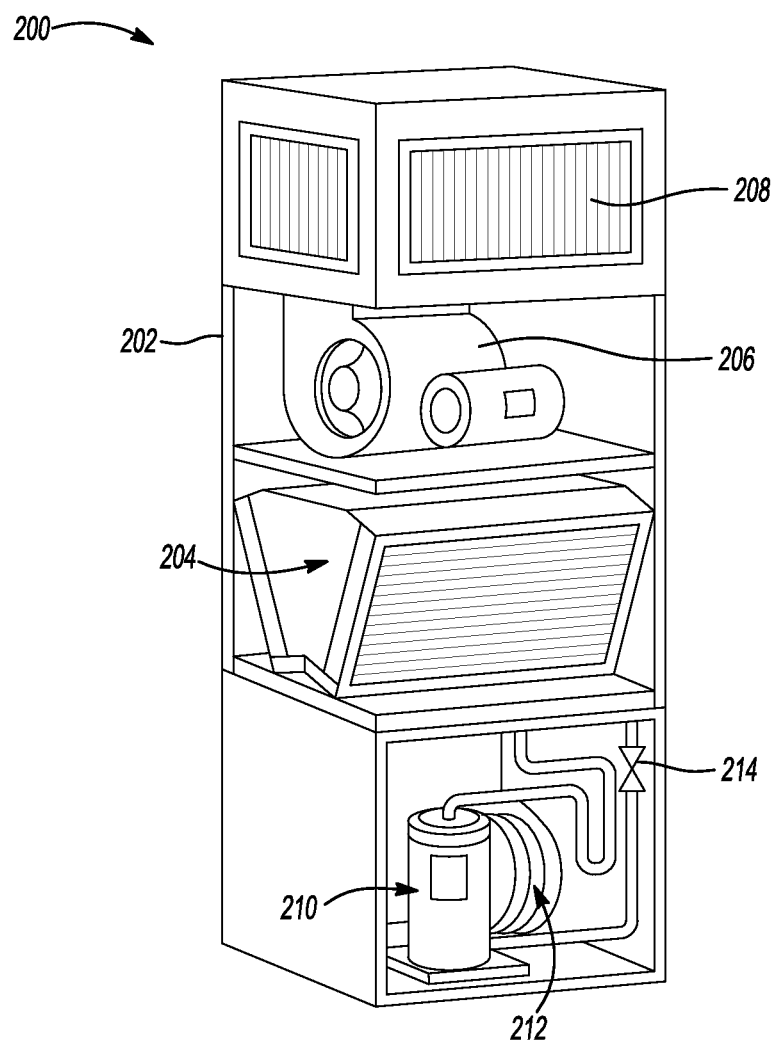
FIG. 2 is a simplified perspective view of a prior art CRAC having a DX cooling circuit.

The temperature at which the controller of the cooling system having a pumped refrigerant economizer mode decides to switch from one mode to the other is based on the difference between the indoor and outdoor temperatures, and the heat load on the cooling system. In an aspect, the cooling system described herein includes the components listed above, which are the typical components of a DX cooling circuit described with reference to FIG. 2, as well as a pump. When the controller decides to switch from DX (compressor) mode to pumped refrigerant economizer mode, the compressor is turned off and the pump is turned on. In the pumped refrigerant economizer mode, the refrigerant is bypassed around the compressor, while in DX (compressor) mode, the refrigerant is bypassed around the pump.

The following description of embodiments of a cooling system having a DX cooling circuit and a pumped refrigerant economizer will show alternative system layouts and component functionality. The three main control considerations for this system operating in the pumped refrigerant economizer mode are capacity control, evaporator freeze prevention (outdoor temperature can get very low) and pump protection. Most pumps require a minimum differential to ensure adequate cooling of the motor (if the pump is a canned motor pump) and lubrication of the bearings. Each of these control functions can be accomplished by a few different methods using different components.

Figure 5:
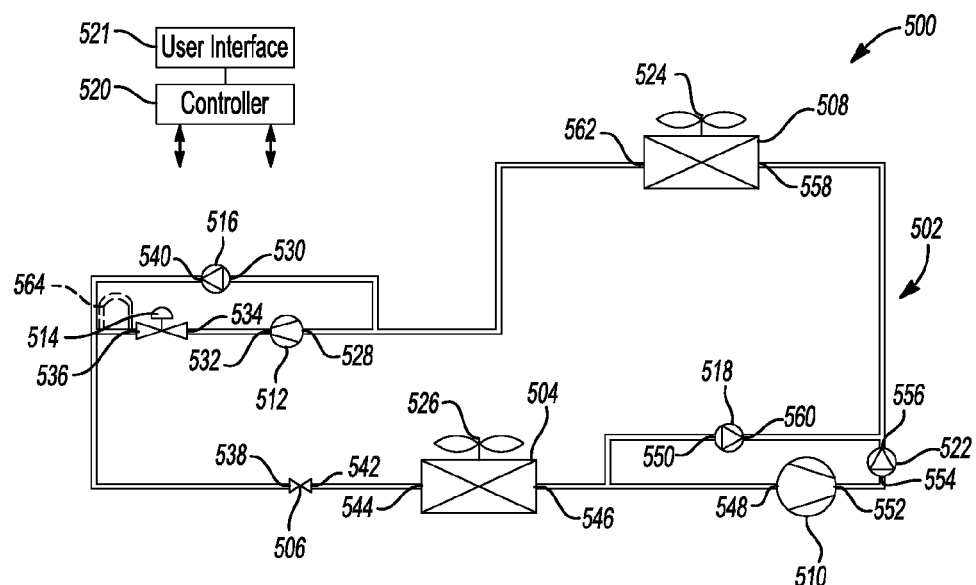
FIG. 5 is a cooling system having a DX cooling circuit with a pumped refrigerant economizer.

With reference to FIG. 5, an embodiment of a cooling system 500 having a pumped refrigerant economizer mode in accordance with an aspect of the present disclosure is shown. Cooling system 500 includes a DX cooling circuit 502 having an evaporator 504, expansion valve 506 (which may preferably be an electronic expansion valve but may also be a thermostatic expansion valve), condenser 508 and compressor 510 arranged in a DX refrigeration circuit. Cooling circuit 502 also includes a fluid pump 512, solenoid valve 514 and check valves 516, 518, 522. An outlet 562 of condenser 508 is coupled to an inlet 528 of pump 512 and to an inlet 530 of check valve 516. An outlet 532 of pump 512 is coupled to an inlet 534 of solenoid valve 514. An outlet 536 of solenoid valve 514 is coupled to an inlet 538 of electronic expansion valve 506. An outlet 540 of check valve 516 is also coupled to the inlet 538 of electronic expansion valve 506. An outlet 542 of electronic expansion valve 506 is coupled to a refrigerant inlet 544 of evaporator 504. A refrigerant outlet 546 of evaporator 504 is coupled to an inlet 548 of compressor 510 and to an inlet 550 of check valve 518. An outlet 552 of compressor 510 is coupled to an inlet 554 of check valve 522 and an outlet 556 of check valve 522 is coupled to an inlet 558 of condenser 508 as is an outlet 560 of check valve 518. The foregoing description corresponds to the description of FIG. 12 of U.S. Ser. No. 13/446,310 for "Vapor Compression Cooling System with Improved Energy Efficiency Through Economization" filed Apr. 13, 2012. The entire of disclosure of U.S. Ser. No. 13/446,310 is incorporated herein by reference.

Cooling system 500 also includes a controller 520 coupled to controlled components of cooling system 500, such as electronic expansion valve 506, compressor 510, pump 512, solenoid valve 514, condenser fan 524, and evaporator air moving unit 526. Controller 520 is illustratively programmed with appropriate software that implements the below described control of cooling system 500. Controller 520 may include, or be coupled to, a user interface 521. Controller 520 may illustratively be an iCOM® control system available from Liebert Corporation of Columbus, Ohio programmed with software implementing the additional functions described below.

Pump 512 may illustratively be a variable speed pump but alternatively may be a fixed speed pump. Condenser fan 524 may illustratively be a variable speed fan but alternatively may be a fixed speed fan.

Where pump 512 is a variable speed pump, cooling capacity of cooling circuit 502 when in the pumped refrigerant economizer mode is controlled by controller 520 by modulating the speed of pump 512. That is, to increase cooling capacity, controller 520 increases the speed of pump 512 to increase the rate of flow of refrigerant in cooling circuit 502 and to decrease cooling capacity, controller 520 decreases the speed of pump 512 to decrease the rate of flow or refrigerant in cooling circuit 502. The refrigerant temperature at the inlet of evaporator 504 is maintained above freezing by controller 520 modulating the speed of fan 524 of condenser 508 and the minimum pump differential is maintained by controller 520 modulating the electronic expansion valve 506. Pump differential means the pressure differential across the pump. In this regard, when pump 512 is a variable speed pump, it may illustratively be a hermetically sealed pump cooled by the refrigerant that is flowing through it as it is pumping the refrigerant and thus a minimum pump differential is needed so that pump 512 is adequately cooled.

Where pump 512 is a fixed speed pump, cooling capacity of cooling circuit 502 is controlled by controller 520 modulating electronic expansion valve 506 to increase or decrease the rate of flow of refrigerant in cooling circuit 502.

In DX (compressor) mode, controller 520 controls compressor 510 to be running, solenoid valve 514 to be closed and pump 512 to be off. Since compressor 510 is running, suction at an inlet 548 of compressor 510 draws vaporized refrigerant from an outlet 546 of evaporator 504 into compressor 510 where it is compressed by compressor 510, raising its pressure. The suction at the inlet 548 of running compressor 510 will draw the refrigerant into the inlet 548 and it doesn't flow through check valve 518. The refrigerant then flows through check valve 522 into condenser 508 where it is cooled and condensed to a liquid state. Since solenoid valve 514 is closed and pump 512 is off, after the refrigerant flows out of condenser 508 it flows through check valve 516, through expansion valve 506 where its pressure is reduced and then into evaporator 504. The refrigerant flows through evaporator 504, where it is heated to vaporization by air to be cooled flowing through evaporator 504, and then back to the inlet 548 of compressor 510.

When controller 520 switches cooling circuit 502 to the pumped refrigerant economizer mode, it opens solenoid valve 514, turns compressor 510 off and pump 512 on. Pump 512 then pumps the refrigerant to circulate it and it flows through solenoid valve 514, electronic expansion valve 506, evaporator 504, check valve 518 bypassing compressor 510, through condenser 508 and back to an inlet 528 of pump 512. Controller 520 switches cooling circuit 502 to the pumped refrigerant economizer mode when the temperature of the outside air is cold enough to provide the requisite temperature differential between the inside air to be cooled and the outside air to which heat is rejected.

In an aspect, an inverted trap 564 may be coupled between outlet 536 of valve 514 and inlet 538 of electronic expansion valve 506 as shown in phantom in FIG. 5.

In an aspect, a receiver/surge tank, such as receiver/surge tank 622 described below, may be coupled between outlet 562 of condenser 508 an inlet 528 of pump 512 so that all refrigerant flow through the receiver/surge tank prior to entering inlet 528.

Figure 6:
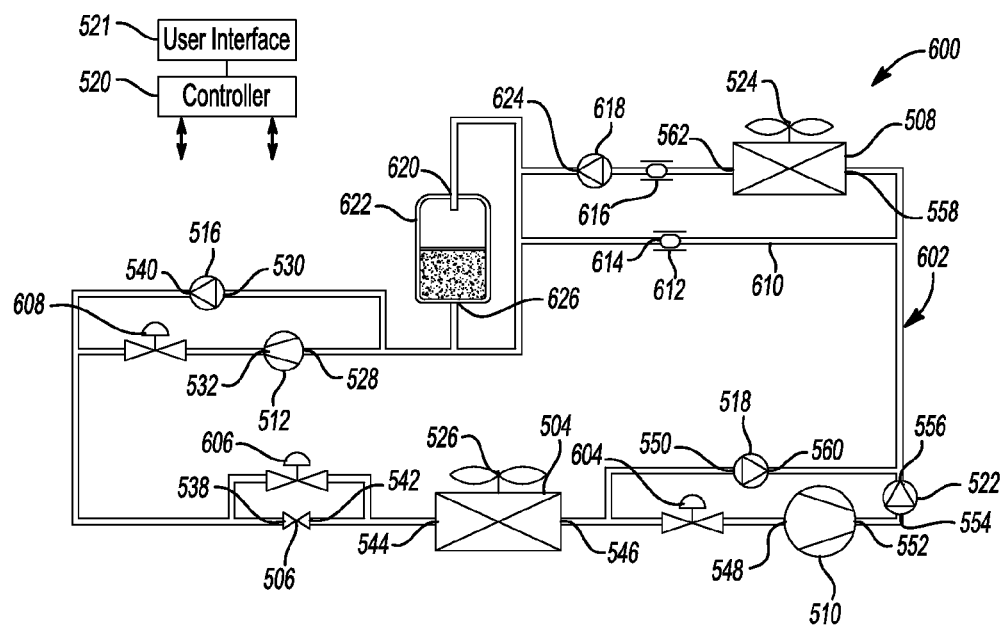
FIGS. 6, 7A and 7B are variations of the cooling system of FIG. 5.

FIG. 6 shows a cooling system 600 having a cooling circuit 602 that is a variation of cooling circuit 502. With the following differences, cooling system 600 is otherwise essentially the same as cooling system 500 and otherwise operates in the same manner as cooling system 500. In cooling system 600, a solenoid valve 604 is added at the inlet 548 of compressor 510 that is controlled by controller 520 to prevent liquid slugging to the compressor. When cooling system 600 is in the DX (compressor) mode, controller 520 opens solenoid valve 604. When cooling system 600 is in the pumped refrigerant economizer mode, controller 520 closes solenoid valve 604 thus preventing refrigerant from flowing to inlet 548 of compressor 510 and preventing liquid slugging of compressor 510. A bypass solenoid valve 606 is also added around electronic expansion valve 506 and a distributor (not shown) that distributes the refrigerant to the circuits of the evaporator includes an inlet port that bypasses the orifice of the distributor, and the outlet of the bypass solenoid valve 606 is plumbed to this bypass inlet to reduce system pressure drop. In cooling system 600, the pump differential is maintained by controller 520 modulating a discharge control valve 608 at discharge outlet 532 of pump 512. It should be understood that while discharge control valve 608 is shown with the same valve symbol as used for solenoid valves, discharge control valve 608 is a variable flow valve as opposed to an on-off valve. In this embodiment, pump 512 is variable speed pump and controller 520 modulates the speed of pump 512 to control a flow rate of the refrigerant being circulated to control the cooling capacity of cooling system 500 when cooling system 500 is in the pumped refrigerant economizer mode. Cooling circuit 602 of cooling system 600 also includes bypass line 610 around the condenser 508 with bypass control valve 612 in bypass line 610 to allow flow of the warm refrigerant around the condenser 508 to mix with cold refrigerant flowing from outlet 562 of condenser 508 to maintain the desired temperature and prevent evaporator freezing. Bypass control valve 612 is a variable flow valve and is illustratively controlled by controller 520. A pressure regulating valve 616 and a check valve 618 are coupled in series between outlet 562 of condenser 508 and to an inlet 620 of receiver/surge tank 622. An outlet 614 of bypass control valve 612 is also coupled to inlet 528 of pump 512 and to inlet 620 of receiver/surge tank 622, and thus also coupled to an outlet 624 of check valve 618. An outlet 626 of receiver/surge tank 622 is coupled to inlet 528 of pump 512. In the previously discussed embodiment of FIG. 5, no receiver/surge tank 622 is required because the cooling system is run in pumped refrigerant economizer mode by controller 520 with the same distribution of refrigerant as in DX (compressor) mode (liquid between the condenser and the evaporator inlet, liquid-vapor mix in the evaporator, and vapor between the evaporator outlet and the condenser inlet). With receiver/surge tank 622, controller 520 can run cooling system 600 to overfeed evaporator 504 so that there would be a liquid-vapor mix between evaporator outlet 546 and condenser 508. This increases the cooling capacity of cooling system 600 compared to the previously discussed embodiments, but the addition of receiver/surge tank 622 adds cost. It should be understood that receiver/surge tank 622 can be used with the previously discussed embodiments and doing so makes the system less charge sensitive. That is, the system can accommodate wider variations in refrigerant charge levels.

Figure 7A:
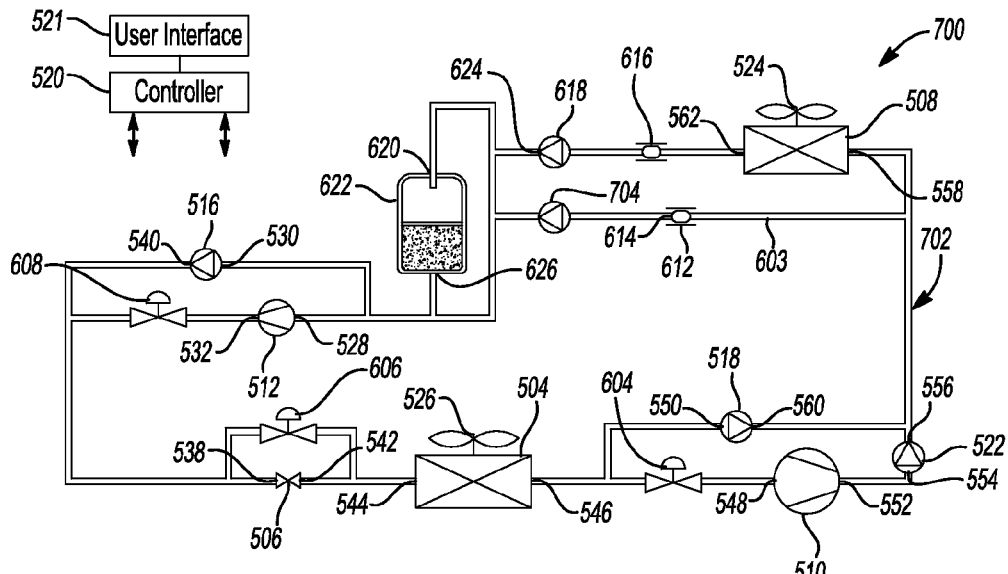

FIG. 7A shows a cooling system 700 that is a variation of cooling system 600 having a cooling circuit 702. With the following differences, cooling system 700 is otherwise essentially the same as cooling system 600 and otherwise operates in the same manner as cooling system 600. Outlet 614 of bypass control valve 612 is coupled through check valve 704 to inlet 620 of receiver/surge tank 622 and to inlet 528 of pump 512 and outlet 624 of check valve 618 is also coupled to inlet 620 of receiver/surge tank 622 and to inlet 528 of pump 512. The refrigerant preferentially flows through receiver/surge tank 622 prior to entering inlet 528 of pump 512, but may flow around receiver surge tank 622.

Figure 7B:
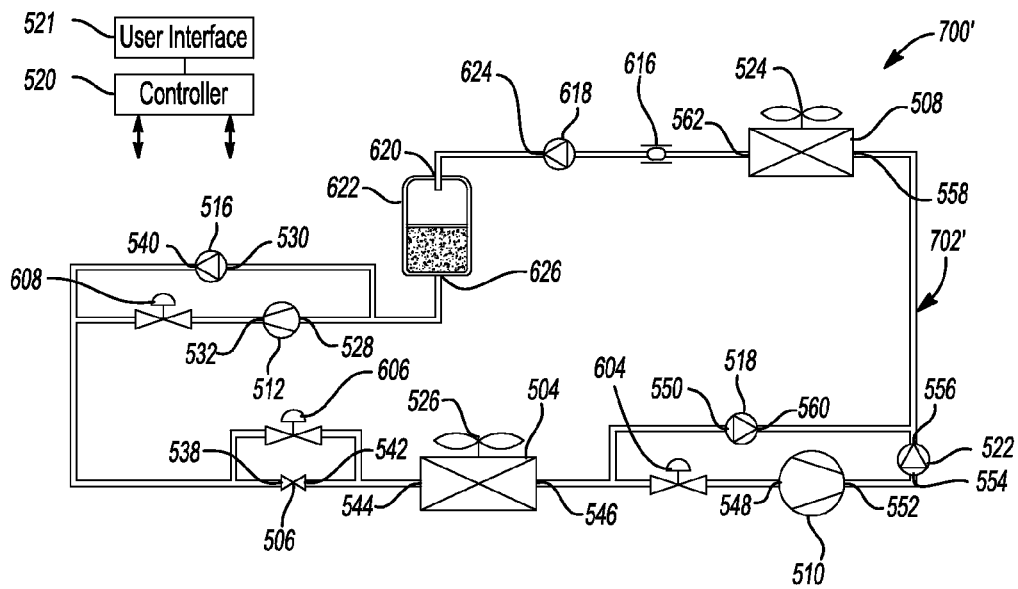

FIG. 7B shows a cooling system 700' that is also a variation of cooling system 600 having cooling circuit 702'. Bypass control valve 612 and check valve 704 are eliminated and the outlet of check valve 618 is coupled to the inlet 620 of receiver/surge tank 622 but not to the inlet 528 of pump 512. In cooling system 700', all the refrigerant flows through receiver/surge tank 622 prior to entering inlet 528 of pump 512.

Figure 8:
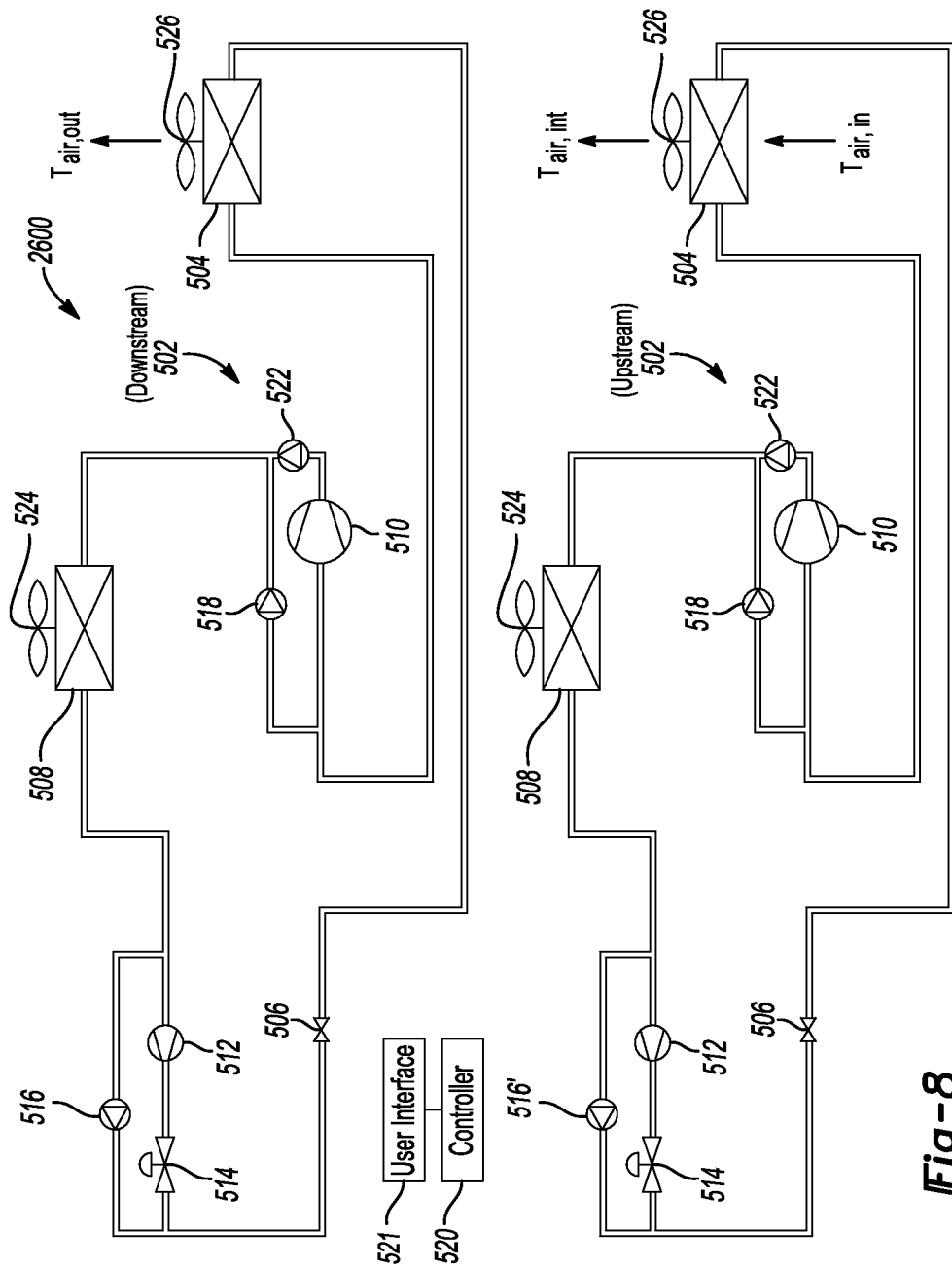
FIG. 8 is a schematic showing a cooling system having staged cooling provided by two cooling circuits of FIG. 5.

The discussions of the cooling circuits of FIGS. 5, 6, 7A and 7B were based on a one circuit cooling system, or on a two circuit system in which the evaporators are parallel in the air-stream. The cooling circuits of FIGS. 5, 6, 7A and 7B can also be utilized for staged cooling as described above, particularly with reference to FIG. 3, where the evaporators of the two circuits are staged in series in the air stream of air to be cooled. Because of this, the entering air temperature is higher on the upstream circuit than on the downstream circuit. Subsequently, the evaporating temperature is higher on the upstream circuit as well. So with the staged system, the upstream circuit will be able to switch over to pumped refrigerant economizer mode before the downstream cooling circuit, which could still be operating in DX (compressor) mode depending on the load. For example, two cooling circuits 502 could be arranged with their evaporators in series to provide staged cooling. FIG. 8 shows a cooling system 800 having two cooling circuits 502 arranged to provide staged cooling along the lines discussed above with regard to FIG. 3. In this embodiment, compressor 510 in each of the two cooling circuits 502 may illustratively be a tandem digital scroll compressor.

In a staged cooling system having two or more staged cooling circuits, at least the most upstream cooling circuit is a variable capacity cooling circuit and preferably the downstream cooling circuit (or circuits) is also variable capacity cooling circuits. Such variable capacity may be provided by the use of a tandem digital scroll compressor as discussed above. It can also be provided by the use of a single variable capacity compressor, such as a digital scroll compressor, a plurality of fixed capacity compressors, or other combinations of fixed and variable capacity compressors. Variable capacity is also provided by the liquid pump when the cooling circuit is a pumped refrigerant cooling circuit, or operating in the pumped refrigerant economizer mode such as cooling circuit 502 operating in the pumped refrigerant economizer mode.

The advantage to using a cooling system with staged cooling as discussed above with this pumped refrigerant economizer is that hours of operation can be gained in pumped refrigerant economizer mode on the upstream cooling circuit since it is operating at a higher evaporating temperature than either cooling circuit would be in a typical prior art parallel evaporator system. So, energy can be saved for more hours of the year. The colder the climate is, the more annual energy efficiency increase can be realized.

As has been discussed, in a typical vapor compression refrigeration system, a large percentage of system power is used to compress the refrigerant vapor leaving the evaporator, thereby increasing the condensing temperature of the refrigerant to allow for heat rejection in the condenser. As described above, particularly with reference to FIG. 5, in an aspect of the present disclosure in order to save energy in a vapor compression refrigeration system, a pump can be used to move refrigerant from the condenser to the evaporator when outdoor temperatures are low enough to provide "free" cooling without the need to compress the refrigerant vapor. Such a pumped refrigerant (economizer) system is a precision cooling system with aims of energy savings, high efficiency and optimized system performance. System control is important to achieving these objectives. More specifically, the control objectives are divided into three levels with different priorities, namely:

1. Component Safety Level: to guarantee key component safety
   i) Pump cavitation prevention—Subcooling monitoring
   ii) Ensuring pump cooling and lubrication
   iii) Evaporator coil freeze protection
2. Performance Level: to run the system functionally and flawlessly
   i) Maintain controlled air temperature to the setpoint
   ii) Proper and smooth working mode switchover
   iii) Fault detection and alarm handling
3. Optimization Level
   i) Extending economizer running hours
   ii) Advanced fault detection and diagnosis The resources available for the system to achieve the above-listed objectives are the installed actuators, which include a variable-speed pump (e.g., pump 512 in FIG. 5), a variable-speed condenser fan (e.g., fan 524 in FIG. 5) and an electronic expansion valve (EEV) (e.g., EEV 506 in FIG. 5). The first step of the control design is to work out a control strategy to decide how to allocate the resources to different control tasks. In other words, given that the entire economizer system is a multi-input multi-output system (with multiple actuators and multiple variables to be controlled), how to decouple the system and determine the input-output relationship is the solution that the following control strategy implements. This control strategy is summarized on a high level basis as follows:

Manipulate the condenser fan to control the refrigerant temperature leaving the condenser;
Manipulate the pump to control system capacity, and ultimately the air temperature in the controlled space;
Manipulate the EEV to control pressure differential across the pump.

The multi-input and multi-output pumped refrigerant economizer system is controlled in a relatively simple way. The system is decoupled into three feedback control loops which regulate their controlled variables by manipulating their corresponding control inputs as follows:

The aforementioned control strategy benefits the system in several ways:

1. The condenser fan controls the refrigerant temperature to a setpoint such that"
   a. Refrigerant temperature will not be low enough to freeze the evaporator coil;
   b. Subcooling is maximized to prevent pump cavitation;
   c. Condenser fan speed is optimized to save energy in the sense that the fan speed can't be further reduced without compromising subcooling and cooling capacity.
2. The pump speed controls refrigerant flow rate, and the capacity in turn, by controlling the room's air temperature to the user given setpoint.
   a. Pump speed is roughly linear with respect to capacity for a fixed refrigerant temperature, which is maintained by the condenser fan speed control.
   b. Linearity facilitates high control precision of the air temperature in the controlled space.
3. The EEV controls the differential pressure across the pump such that
   a. The pump motor is sufficiently cooled;
   b. The pump bearings are sufficiently lubricated.

The entire system energy consumption is optimized by the foregoing control strategy in the sense that no further energy consumption can be realized without sacrificing cooling performance.

Figure 9:
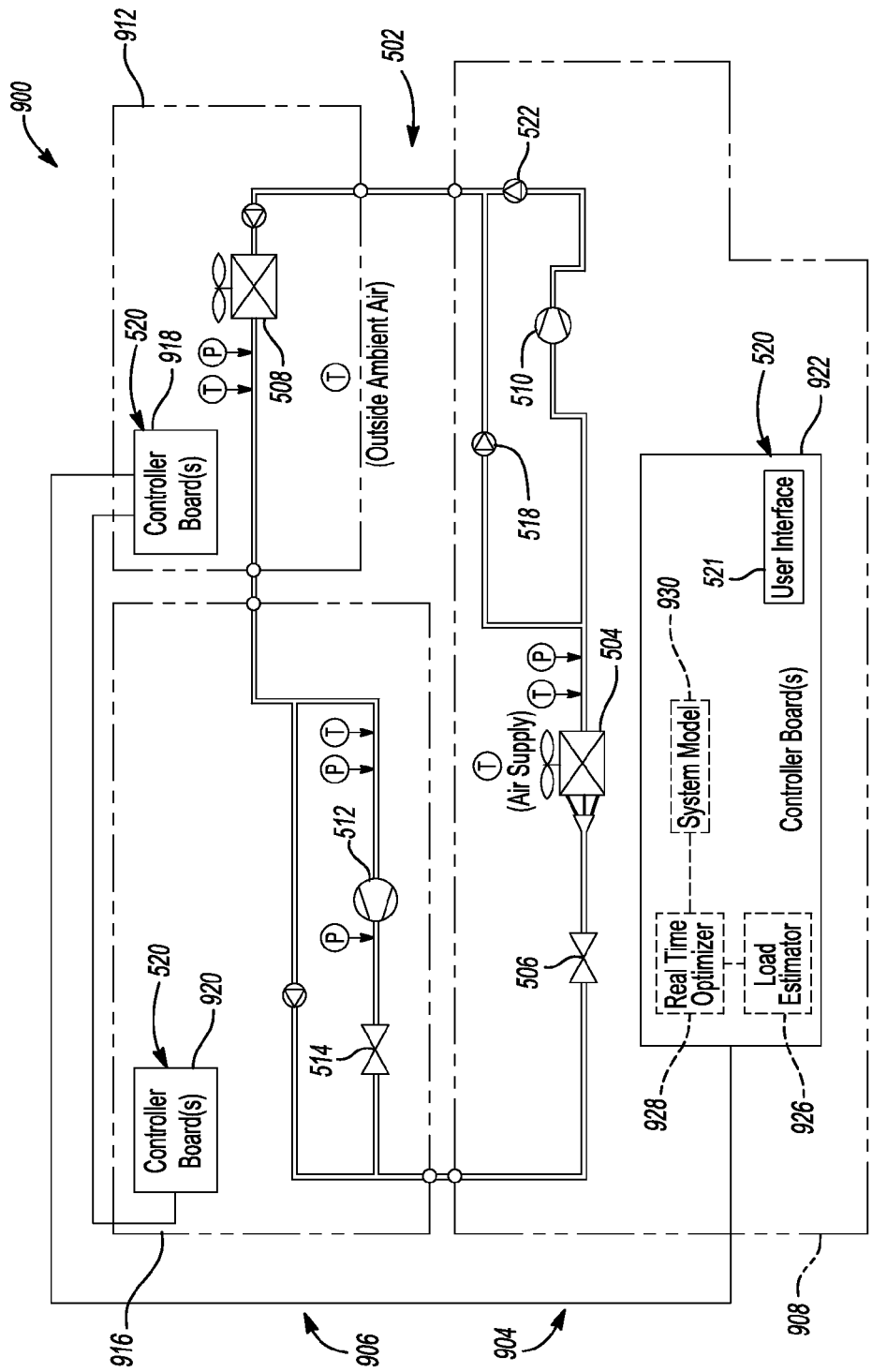
FIG. 9 is a schematic showing the cooling system of FIG. 5 and showing in more detail the control system therewith.

FIG. 9 is a schematic of a cooling system 900 having one cooling circuit 502 having a DX cooling circuit 904 and a pumped refrigerant economizer circuit 906. Cooling system 900 may physically consist of three units: an indoor unit 908 (illustratively a computer room air conditioner), a pumped refrigerant economizer unit 916, and an air-cooled condenser unit 912. The indoor unit 908 is located inside the room to be cooled, such as a data center room, and contains the major components of the DX cooling circuit (other than the condenser 508), including the evaporator 504, compressor 510, and expansion valve 506, etc. The indoor unit's 908 functionality is to operate the system in a standard direct expansion mode, and also drive the valves needed to run the system in pumped refrigerant economizer mode. The pumped refrigerant economizer unit 916 is located outside the room and contains the major components including pump 512, etc. The pumped refrigerant economizer unit 916 uses liquid pump 512 to move refrigerant from the condenser 508 to the evaporator 504 when the outdoor temperatures are low enough to provide "free" cooling without running a direct expansion refrigeration system. The condenser unit 912 is also located outside the room to be cooled but separated from the pumped refrigerant economizer unit 916. It cooperates with one of the other two units 908, 916 according to heat rejection demand. In FIG. 9, "T" in a circle is a temperature sensor and "P" in a circle is a pressure sensor, in each instance that are coupled to controller 520, such as to a respective one of controller boards 918, 920, 922 (which are discussed below). The temperature sensors include an outside ambient air temperature sensor (shown adjacent condenser 508) and a supply air (or room return air) temperature sensor (shown adjacent evaporator 504). The remaining temperature sensors sense temperatures of the refrigerant at the indicated locations of cooling circuit 502 and the pressure sensors sense the pressures of the refrigerant at the indicated locations of cooling circuit 502.

Figure 10:
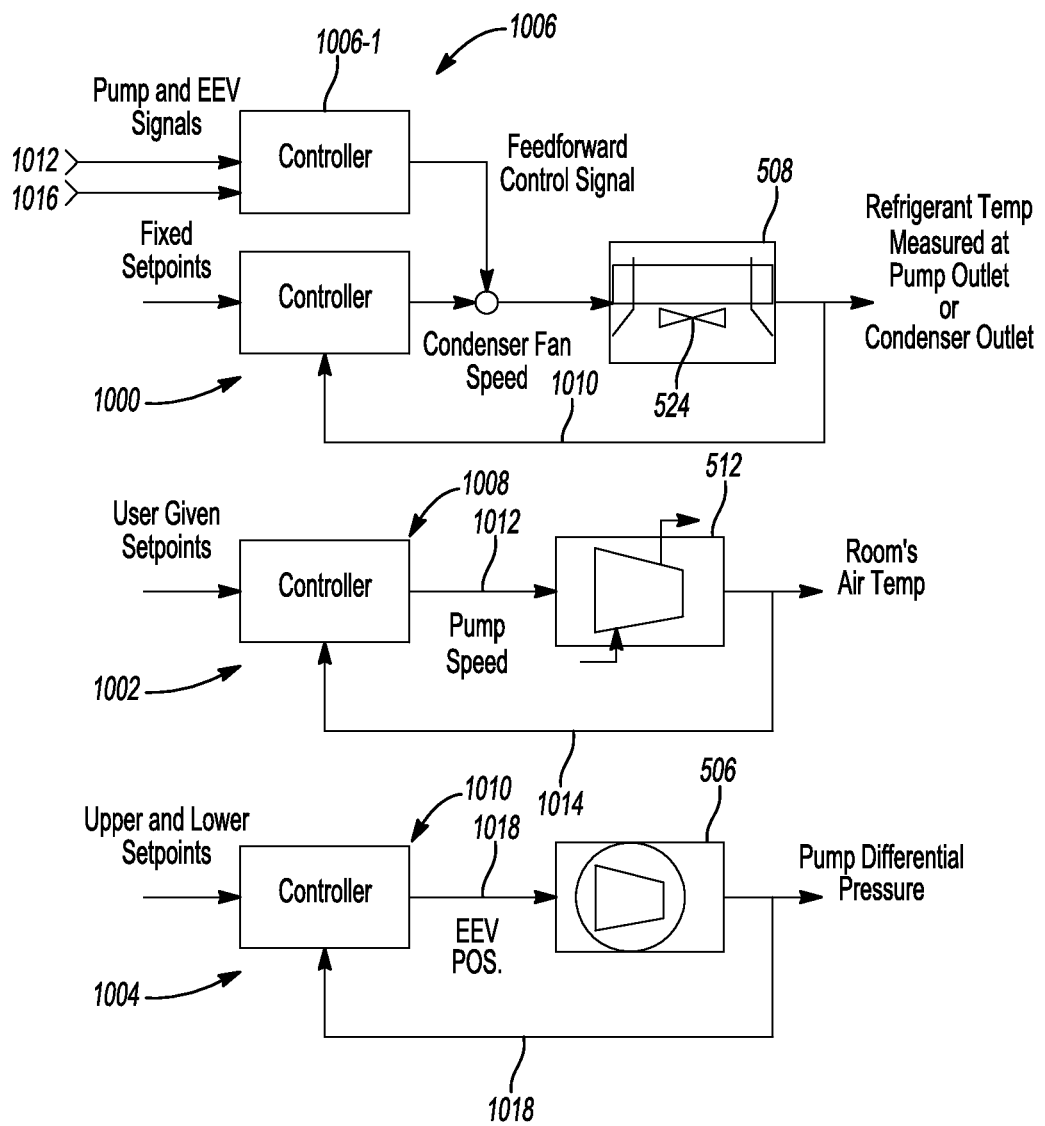
FIG. 10 shows control loops for the control system of FIG. 9.

When the cooling system 900 operates in pumped refrigerant economizer mode, there are three feedback control loops for the basic control of the pumped refrigerant economizer mode, as shown in FIG. 10.

A refrigerant temperature feedback control loop 1000 controls the refrigerant temperature to a setpoint by regulating the condenser fan speed. The refrigerant temperature is measured at the pump outlet or at the condenser outlet. In an aspect, the setpoint is set in the range of 37° F. to 42° F. It should be understood that these values are exemplar and the fixed setpoint can be other than 37° F. to 42° F. It should also be understood that the setpoint can be inputted manually, such as by a user, or determined by a controller such as controller 520.

A room air temperature feedback control loop 1002 controls the room's air temperature to the setpoint entered by a user, such as into controller 520, by regulating the pump speed.

An liquid pump differential pressure feedback control loop 1004 maintains the liquid pump differential pressure (PSID) within a given range by regulating the EEV 506 opening. In an aspect, the given range is set to be 20 PSID to 25 PSID. The given range is determined by its upper and lower setpoints. It should be understood that these values are exemplar and the given range can be other than 20 PSID to 25 PSID. It should also be understood that that the given range could be input by a user.

Each control loop 1000, 1002, 1004 may illustratively be a process control type of control loop, and may preferably be a PID loop. In the embodiment shown in FIG. 10, each control loop 1000, 1002, 1004 is shown implemented with a separate controller 1006, 1008, 1010, respectively, such as to co-locate a respective controller board(s) 918, 920, 922 (FIG. 9) having each controller 1006, 1008, 1010 in proximity to the device it is controlling, and controllers 1006, 1008, 1010 communicate with each other, such as via a controller area network (CAN) bus. For example, the controller board(s) 918 having controller 1006 is located in proximity to condenser 508 in that controller 1006 controls the speed of condenser fan 524. The controller board 920 having controller 1008 is located in proximity to pump 512 in that controller 1008 controls the speed of pump 512. The controller board(s) 922 having controller 1010 is collocated in proximity to EEV 506 in that controller 1010 controls the position of EEV 506. While controllers 1006, 1008, 1010 are implemented on separately located controller boards in this embodiment, controllers 1006, 1008 and 1010 are collectively considered part of controller 520. It should be understood that control loops 1000, 1002 and 1004 could be implemented on a controller board(s) at a single location along with the remainder of the control functions of controller 520.

Refrigerant temperature feedback control loop 1000 has an output at which a condenser fan speed control signal is output and has as inputs the refrigerant temperature setpoint and a feedback signal which is the actual refrigerant temperature, such as by way of example and not of limitation, at the outlet of the condenser. The room air temperature feedback control loop 1002 has an output at which a liquid pump speed control signal is output and has as inputs the room air temperature setpoint and a feedback signal which is the actual room air temperature, such as by way of example and not of limitation, at the return air inlet of the cooling system. The liquid pump pressure differential control feedback loop 1004 has an output at which an electronic expansion valve position signal is output and having as inputs the given range and a feedback signal which is a pressure differential across the liquid pump.

In order to further improve the transient performance of the refrigerant temperature control (which is controlled by controlling the speed of condenser fan 524 by control loop 1000), a feedforward controller (controller 1006-1 in FIG. 10) is applied to stabilize refrigerant temperature by using the pump speed control signal 1012 from controller 1008 and the EEV control signal 1018 from controller 1010 as its inputs. The rationale is that refrigerant temperature is related to the flow rate that can be estimated by the pump speed and EEV opening. The outputs 1012, 1018 of controllers 1008 and 1010 of FIG. 10 are fed forward to the condenser fan speed control loop 1000. The condenser fan speed signal consists of two parts: feedback signal and feedforward signal. Thus, the condenser fan can respond by being driven by the feedforward signal in advance of the feedback signal coming back.

The three control loops have different magnitudes of response time, which prevents the situation in which multiple control elements can interact to create instability in the control.

This control strategy applies to the pumped refrigerant economizer system particularly and can also be applied to the class of cooling or air conditioning systems with pumped refrigerant circulation.

The foregoing description of cooling system 900 is based on a cooling system having one cooling circuit. A similar control strategy can be applied to cooling systems having two cooling circuits, such as those arranged to provide staged cooling as discussed above. For a cooling system having two cooling circuits, such as having staged cooling with two cooling circuits, the condenser fan and EEV in the second circuit perform the same respective control tasks as in the first circuit. The cooling capacity is controlled by the aggregate pump speeds. A control algorithm, an example of which is discussed below, determines the capacity contributed by each pump, and hence decides each pump's speed.

As discussed, when the cooling system is in the pumped refrigerant economizer mode, there are three main controlled parameters: room temperature, refrigerant temperature and pump pressure differential (outlet pressure minus inlet pressure). The room temperature is controlled by modulating the pump speed via a variable frequency drive. In a cooling system having staged cooling with two or more cooling circuits, when the cooling system is in the pumped refrigerant economizer mode, the cooling load requirement will determine if the pump in one or more than one of the cooling circuits needs to be operated.

In an illustrative embodiment, controller 520 switches the cooling system, such as cooling system 800, to the pumped refrigerant economizer mode when there is either a minimum difference between the room return air temperature entering the cooling system and the outdoor air temperature or the outdoor air temperature is below a minimum (such as below 35° F. in the example below). In an aspect, the lower of the actual room return air temperature and the setpoint is used for the comparison. In an aspect, the minimum temperature difference between the room return air is 45° F. and the minimum outside air temperature is 35° F. It should be understood that these temperatures are examples and minimum temperature difference other than 45° F. and a minimum outside air temperature other than 35° F. can be used. As discussed above, in an aspect, the cooling circuits in a system having staged cooling may be controlled separately in which case the room air temperature used for the comparison for each cooling circuit may be the actual room return air temperature (or its setpoint if lower) entering the evaporator 504 of that cooling circuit 502.

In an aspect, controller 520 will switch the cooling system from pumped refrigerant economizer mode to direct expansion mode when the pumped refrigerant economizer mode is not keeping up with the cooling demand. In the event that the cooling system has staged cooling, in an aspect controller 520 will first switch the most downstream cooling circuit from the pumped refrigerant economizer mode to direct expansion mode and if this fails to provide sufficient cooling, then successively switches each next upstream cooling circuit in turn to the direct expansion mode.

In an aspect, controller 520 also switches each cooling circuit from the pumped refrigerant economizer mode to the direct expansion mode should the pump differential pressure of the pump 512 of that cooling circuit fall below a predetermined minimum for a predetermined period of time. This prevents pump failure due to insufficient pump differential pressure.

In an aspect, controller 520 also switches each cooling circuit from the pumped refrigerant economizer rode to the direct expansion mode if the temperature of the refrigerant leaving the pump of that cooling circuit falls below a predetermined temperature for a predetermined period of time.

In an aspect, controller 520 may also switch each cooling circuit from the pumped refrigerant economizer mode to the direct expansion mode in the event of a condition indicating a failure of the pumped refrigerant economizer mode, such as loss of power to the pump.

In an aspect, the controller includes a real-time load estimator 926 (shown in phantom in FIG. 9) that estimates real-time indoor heat load on the cooling system and uses the estimated real-time indoor heat load to determine whether to operate the cooling system in the pumped refrigerant economizer mode or in the direct expansion mode. In an aspect, the load estimator calculates the real-time indoor heat load based on the indoor return air temperature (for example, the temperature of the room air at the return air inlet of the CRAC], the supply air temperature (for example, the temperature of the cooled air exiting the CRAC) and the volume of air flow across the evaporator. It may for example do so using the following equation (implemented in software) in the controller:

$$\dot{Q}_{sensible} = \%_{fan\ speed} \times \dot{m}_{@100\%\ fan\ speed} \times c_p \times (T_{return\ air} - T_{supply\ air})$$

where $\dot{m}$ is the mass flow rate of the air flowing across the evaporator, and $c_p$ is the molar heat capacity at a constant pressure of the air flowing across the evaporator.

In an aspect, if supply air temperature or return air temperature is not available, the load estimator uses compressor loading information instead. In an aspect, compressor loading is determined by $$\max[CFC, 20\%] * M_{CAP}$$

where CFC is the call for cooling and $M_{CAP}$ is the maximum capacity coefficient of the compressor determined from a 2D lookup table, whose inputs are the indoor control temperature and the outdoor temperature. CFC is the actual cooling that the cooling system is being called on to provide, typically expressed as a percentage of the overall or nominal maximum cooling capacity of the cooling system.

The capacity of the cooling system, such as any of cooling systems 500, 600, 700, 700', is a function of the difference between the indoor return air temperature (referred to as "indoor temperature") and outdoor temperature. Controller 520 obtains the current real-time load information of the cooling system from its real time load estimator 926. Given the condition of the indoor temperature, outdoor temperature and real-time load information, controller 520 determines whether it is feasible to run the cooling system in the pumped refrigerant economizer mode. For example, if the cooling system is able to reach a full capacity of 125 kW at a 40 degF difference between indoor and outdoor temperature, the current indoor temperature is controlled to a set point of 80 degF and the load is 50% (62.5 kW), controller 520 determines that the cooling system can be operated in the pumped refrigerant economizer mode when the outdoor temperature is 60 degF or below. A simplistic control equation for the foregoing is:

$$\text{Outdoor Temp.} = \text{Indoor Temp. Setpoint} - (\% \text{ Load} \times \text{Max Temp Diff.})$$

Where Outdoor Temp. is the outdoor temperature at or below which the cooling system can be run in the pumped refrigerant economizer mode, Indoor Temp. Setpoint is the setpoint for the indoor temperature, % Load is the real-time indoor load on the cooling system (that may be estimated as discussed above) as a percent of the maximum load of the cooling system, and Max. Temp. Diff is the temperature difference between indoor temperature and outdoor temperature at which the pumped refrigerant economizer can be operated to provide full capacity.

Figure 11:
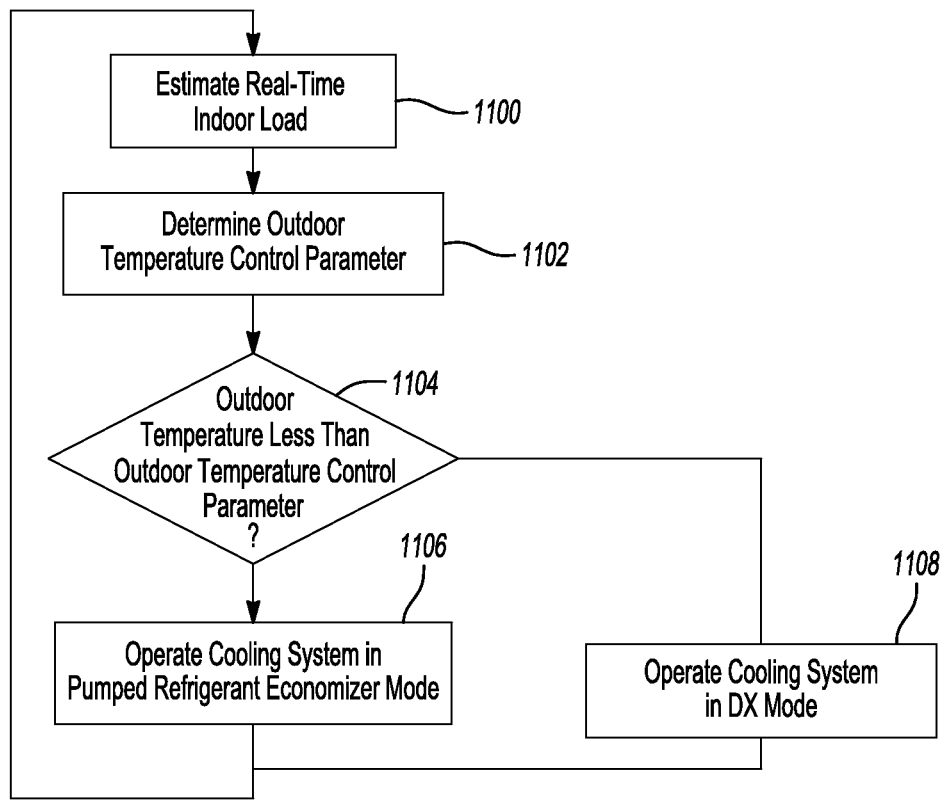
FIG. 11 is a flow chart showing an illustrative control of a cooling system utilizing a load estimator in accordance with an aspect of the present disclosure.

FIG. 11 is a basic flow chart for a software routine for control of the cooling system utilizing the real time load estimator 926, and may illustratively be part of the software of controller 520. At 1100, controller 520 estimates real time indoor load as described above. At 1102, controller 520 determines the Outdoor Temp. control parameter based on the above control equation. At 1104, controller 520 checks whether the actual outdoor temperature is below the Outdoor Temp. control parameter. If so, at 1106 controller 520 operates the cooling system in the pumped refrigerant economizer mode. If not, at 1108 controller 520 operates the cooling system in the DX mode.

It should be understood that in cooling systems having a plurality of cooling circuits each with a pumped refrigerant economizer mode and a DX mode, the controller makes the above determination for each cooling circuit as to the outdoor air temperature at or below that cooling circuit can be operated in the pumped refrigerant economizer mode.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As used herein, the term controller, control module, control system, or the like may refer to, be part of, or include an Application Specific Integrated Circuit (ASIC); an electronic circuit; a combinational logic circuit; a field programmable gate array (FPGA); a processor (shared, dedicated, or group) that executes code; a programmable logic controller, programmable control system such as a processor based control system including a computer based control system, a process controller such as a PID controller, or other suitable hardware components that provide the described functionality or provide the above functionality when programmed with software as described herein; or a combination of some or all of the above, such as in a system-on-chip. The term module may include memory (shared, dedicated, or group) that stores code executed by the processor.

The term software, as used above, may refer to computer programs, routines, functions, classes, and/or objects and may include firmware, and/or microcode.

The apparatuses and methods described herein may be implemented by software in one or more computer programs executed by one or more processors of one or more controllers. The computer programs include processor-executable instructions that are stored on a non-transitory tangible computer readable medium. The computer programs may also include stored data. Non-limiting examples of the non-transitory tangible computer readable medium are non-volatile memory, magnetic storage, and optical storage.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A cooling system, comprising:
   a cabinet having an air inlet and an air outlet;
   a first cooling circuit that includes an evaporator disposed in the cabinet, a condenser, a compressor, an expansion device and a liquid pump;
   the cooling system having a direct expansion mode wherein the compressor is on and compresses a refrigerant in a vapor phase to raise a pressure of the refrigerant and thus a condensing temperature of the refrigerant and the refrigerant is circulated around the first cooling circuit by the compressor and a pumped refrigerant economizer mode wherein the compressor is off and the liquid pump is on and pumps the refrigerant in a liquid phase and the refrigerant is circulated around the first cooling circuit by the liquid pump and without compressing the refrigerant in vapor phase;
   a controller coupled to the liquid pump and the compressor that turns the compressor off and the liquid pump on to operate the first cooling circuit in the pumped refrigerant economizer mode and turns the compressor on and the liquid pump off to operate the first cooling circuit in the direct expansion mode; and the controller including a load estimator that estimates real-time indoor heat load on the cooling system and uses the estimated real-time indoor heat load to determine an outdoor temperature control parameter and operates the cooling system in the pumped refrigerant economizer mode when a temperature of outdoor air is less than or equal to the outdoor temperature control parameter and operates the cooling system in the direct expansion mode when the temperature of outdoor air is greater than the outdoor temperature control parameter.

2. The cooling system of claim 1 wherein the load estimator calculates the real-time indoor heat load based on a temperature of indoor return air, a temperature of supply air and a volume of air flow across the evaporator.

3. The cooling system of claim 2 wherein the load estimator uses compressor loading information and the temperature of at least one of the supply air or the return air to estimate the real time indoor heat load.

4. The cooling system of claim 1 including a receiver/surge tank coupled between the condenser and the liquid pump.

5. The cooling system of claim 1 further including a second cooling circuit having an evaporator disposed in the cabinet, a condenser, a compressor, an expansion device and a liquid pump, the cooling system having one of the first or second cooling circuit included in an upstream cooling stage and the other one of the first or second cooling circuit included in a downstream cooling stage wherein the evaporator of the first or second cooling circuit included in the upstream cooling stage is an upstream evaporator and the evaporator of the first or second cooling circuit included in the downstream cooling stage is a downstream evaporator, wherein the upstream evaporator and the downstream evaporator are arranged in the cabinet so that air to be cooled passes over the upstream evaporator and the downstream evaporator in serial fashion, first over the upstream evaporator and then over the downstream evaporator, the first and second cooling circuits are operable in the direct expansion mode and the pumped refrigerant economizer mode wherein when the first cooling circuit is operated in the pumped refrigerant economizer mode the compressor of the first cooling circuit is off and the liquid pump of the first cooling circuit is on and the refrigerant is circulated around the first cooling circuit by the liquid pump of the first cooling circuit, and when the second cooling circuit is operated in the pumped refrigerant economizer mode, the compressor of the second cooling circuit is off and the liquid pump of the second cooling circuit is on and the refrigerant is circulated around the second cooling circuit by the liquid pump of the second cooling circuit in the liquid phase.

6. The cooling system of claim 5 wherein when the upstream cooling stage is in the pumped refrigerant economizer mode, the downstream cooling stage must be in the direct expansion mode, the controller operates the upstream cooling stage in the pumped refrigerant economizer mode by turning the liquid pump of the upstream cooling stage on and the compressor of the upstream cooling stage off, and operates the downstream cooling stage in the direct expansion mode by turning the compressor of the downstream cooling stage on and the liquid pump of the downstream cooling stage off.

7. The cooling system of claim 5 wherein for each of the first and second cooling circuits the controller further determines the outdoor temperature control parameter using the estimated real-time indoor heat load and operates each of the first and second cooling circuit in the pumped refrigerant economizer mode when the outdoor air temperature is at or below the outdoor air temperature control parameter for a respective one of the first or second cooling circuit.

* * * * *